United States Patent
Hayakawa et al.

(10) Patent No.: US 9,559,280 B2
(45) Date of Patent: Jan. 31, 2017

(54) THERMOELECTRIC CONVERSION DEVICE

(71) Applicant: HITACHI, LTD., Tokyo (JP)

(72) Inventors: Jun Hayakawa, Hino (JP); Shin Yabuuchi, Musashino (JP); Masakuni Okamoto, Tokyo (JP); Yosuke Kurosaki, Hachioji (JP); Akinori Nishide, Tokyo (JP)

(73) Assignee: HITACHI, LTD., Tokyo (JP)

( * ) Notice: Subject to any disclaimer, the term of this patent is extended or adjusted under 35 U.S.C. 154(b) by 58 days.

(21) Appl. No.: 14/635,764

(22) Filed: Mar. 2, 2015

(65) Prior Publication Data

US 2015/0280095 A1    Oct. 1, 2015

Related U.S. Application Data

(62) Division of application No. 13/338,740, filed on Dec. 28, 2011, now abandoned.

(30) Foreign Application Priority Data

Dec. 28, 2010   (JP) .................... 2010-291527

(51) Int. Cl.
*H01L 35/30* (2006.01)
*H01L 35/12* (2006.01)
(Continued)

(52) U.S. Cl.
CPC ............. *H01L 35/20* (2013.01); *H01L 35/12* (2013.01); *H01L 35/32* (2013.01); *H01L 37/00* (2013.01)

(58) Field of Classification Search
CPC .......... H01L 35/20; H01L 35/12; H01L 35/32; H01L 37/00
(Continued)

(56) References Cited

U.S. PATENT DOCUMENTS

2007/0034245 A1    2/2007  Nakajima
2007/0125414 A1    6/2007  Bettencourt

FOREIGN PATENT DOCUMENTS

JP    06-69549       3/1994
JP    2000-058931    2/2000
(Continued)

OTHER PUBLICATIONS

Office Action in Japanese Patent Appln. 2010-291527, dispatched Aug. 26, 2014 (2 pgs., in Japanese); [2 pgs., English language translation].

(Continued)

*Primary Examiner* — Lindsey Bernier
(74) *Attorney, Agent, or Firm* — Baker Botts L.L.P.

(57) ABSTRACT

A thermoelectric conversion device includes a Heusler alloy film having a structure of $B_2$ or $L_{21}$ in notation of $A_2BC$ and a pair of electrodes on the Heusler alloy film to output an electromotive force generated by a thermal gradient in the Heusler alloy film. The thermoelectric conversion device further includes an electrode for applying an electric field or a voltage to the Heusler alloy film to increase and control an electric conductivity and a Seebeck coefficient S of the Heusler metal film. The device can control to increase an electric conductivity and Seebeck coefficient S by applying an electric field or a voltage through an insulation film to the Heusler alloy film. The device may have a shared connection to select one of outputs of a plurality of thermoelectric conversion devices arranged in a matrix or increase an electromotive force as an output.

4 Claims, 7 Drawing Sheets

(51) Int. Cl.
*H01L 35/14* (2006.01)
*H01L 35/20* (2006.01)
*H01L 35/32* (2006.01)
*H01L 37/00* (2006.01)

(58) Field of Classification Search
USPC .............. 136/205, 236.1, 239, 240, 214
See application file for complete search history.

(56) References Cited

FOREIGN PATENT DOCUMENTS

| JP | 2003-197985 | 7/2003 |
|---|---|---|
| JP | 2004-119648 | 4/2004 |
| JP | 2005-116680 | 4/2005 |
| JP | 2008-192652 | 8/2008 |
| JP | 2008-218640 | 9/2008 |
| JP | 2009-117430 | 5/2009 |
| JP | 2010-229477 | 10/2010 |
| WO | WO 03/019681 | 3/2003 |

OTHER PUBLICATIONS

English machine translation of JP 2009-117430A.
Lue et al., "Thermal and transport properties of the Heusler-type compounds Fe2—xTi1+xSn." Journal of Applied Physics 96, 2681 (2004).
Geiersbach et al., "Structural, magnetic and magnetotransport properties of thin films of the Heusler alloys Cu2MnAl, Co2MnSi, Co2MnGe and Co2MnSn." Journal of Magnetism and Magnetic materials 240 (2002) 546-549.
Office Action in Japanese Patent Appln. 2010-291527, dispatched Feb. 4, 2014 (5 pgs., in Japanese); [3 pgs., English language translation].
Nakabayashi, M. et al., "Semiconductor Behavior of $Fe_2TiSn$ Heusler Alloy," Summary of Lecture by Japan Institute of Metals, Japan 2002, 130th.

FIG.5

|   | 4  | 5  | 6  | 7  | 8  | 9  | 10 | 11 | 12 | 13 | 14 |
|---|----|----|----|----|----|----|----|----|----|----|----|
| 3 |    |    |    |    |    |    |    |    |    | Al | Si |
| 4 | Ti | V  | Cr | Mn | Fe | Co | Ni | Cu | Zn | Ga | Ge |
| 5 | Zr | Nb | Mo | Tc | Ru | Rh | Pd | Ag | Cd | In | Sn |
| 6 | Hf | Ta | W  | Re | Os | Ir | Pt | Au | Hg | Tl | Pb |

FIG.7
|  | APPLICATION VOLTAGE (POS) | APPLICATION VOLTAGE (NEG) |
|---|---|---|
| $Fe_2VAl$ | >0.5V | >-0.3V |
| $Fe_2NbAl$ | >0.3V | >-0.4V |
| $Fe_2TiSi$ | >0.4V | >-0.4V |
| $Fe_2TiSn$ | >0.1V | >-0.3V |
FIG.8A
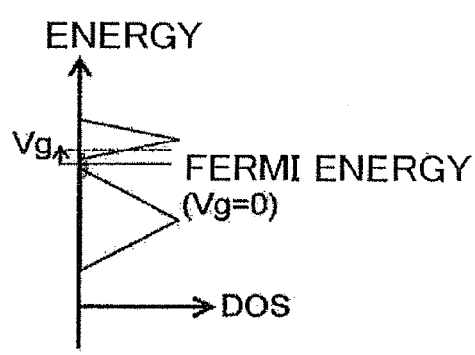
FIG.8B
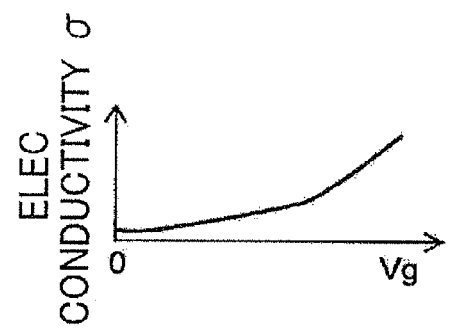
FIG.8C
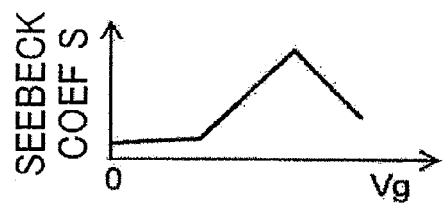

THERMOELECTRIC CONVERSION DEVICE

CROSS REFERENCE TO RELATED APPLICATION

This application is a divisional of U.S. patent application Ser. No. 13/338,740, filed on Dec. 28, 2011, now abandoned which is incorporated by reference in its entirety. The present application claims priority from Japanese Patent Application JP 2010-291527, filed on Dec. 28, 2010, the content of which is herein incorporated by reference into this application.

BACKGROUND OF THE INVENTION

1. Field of the Invention

The present invention relates to a thermoelectric conversion device and particularly to a thermoelectric conversion device including an electrode for electric field to thermoelectric conversion material.

2. Description of the Related Art

Conversion of thermal energy into electric energy using Seebeck effect on a substance is called thermal conversion, and a device capable of the thermal conversion is a thermal conversion device. A material used in the thermal conversion device is called a thermal conversion material. As an index for estimating a thermal conversion effect, a performance index of $Z=S^2\sigma/\kappa$ is used where S is a Seebeck coefficient, $\sigma$ is an electric conductivity, and $\kappa$ is a thermal conductivity.

There are known thermoelectric conversion materials such as (1) a material made of a compound of a semiconductor such as Bi—Te, Si—Ge, and Zn—Sb or a compound having a Skutterudite structure, (2) a material made of $NaCoO_2$ representative of oxide, and (3) compounds having a half Heusler structure such as ZrNiSn.

However, the conventional materials listed above have limitations in the electric conductivity and the Seebeck coefficient. The performance index necessary for realizing the thermoelectric conversion device is defined by ZT (T is a temperature). Generally a ZT equal to or more than one is required, and a ZT equal to or more than two is required partially.

To solve this problem, JP 2009-117430 A discloses a thermoelectric device including a pair of a source electrode S and a drain electrode D for taking out an electromotive force according to a thermal gradient generated in a semiconductor A having a carrier density equal to or smaller than $10^{22}/cm^3$ and for generating the thermal gradient in the semiconductor A by conducting a current, and a gate electrode G for applying an electric field in the vertical direction to a conduction direction of the current between the source electrode S and the drain electrode D. In such a configuration, when a voltage is applied to the gate electrode G, a carrier density on a surface of the semiconductor A just under the gate electrode G varies. When the gate voltage becomes equal to or greater than a predetermined value, carriers are two-dimensionally confined on the surface of the semiconductor A just under the gate electrode G, a quantum effect of which generates a huge thermal electric power. Accordingly, a power factor can be maximized because both the electric conductivity $\sigma$ and an absolute value |S| of the Seebeck coefficient can be increased. However, in JP 2009-117430 A there is also limitation in increase in the electric conductivity because the semiconductor is used.

SUMMARY OF THE INVENTION

An aspect of the present invention provides a thermoelectric conversion device having an electric conductivity and a Seebeck coefficient S greater than conventional thermoelectric conversion devices.

An aspect of the present invention provides a thermoelectric conversion device including a Heusler alloy film having a $B_2$ structure or an $L_{21}$ structure which can be indicated in $A_2BC$ notation, and a pair of electrodes for taking out an electromotive force according to a temperature gradient generated in the Heusler alloy. In addition the thermoelectric conversion device may have a configuration capable of increasing the electric conductivity and the Seebeck coefficient S by applying an electric field or a voltage through an insulation film to the Heusler alloy film. In this configuration, elements used in A, B, C in the $A_2BC$ notation are as follows:

A: a single or a plurality of elements belonging to any of seventh to tenth groups of fourth to sixth periods in the periodic table of element.

B: a single or a plurality of elements belonging to any of fourth to sixth groups of fourth to sixth periods in the periodic table of element.

C: a single element or a plurality of elements belonging to any of thirteenth to fourteenth groups of third to sixth periods in the periodic table of element.

BRIEF DESCRIPTION OF THE DRAWINGS

The object and features of the present invention will become more readily apparent from the following detailed description taken in conjunction with the accompanying drawings in which:

FIG. 5 is a table of elements to illustrate elements forming thermoelectric conversion material according to the present invention;

FIG. 7 is a table of optimum applied voltage values of the thermoelectric conversion devices regarding a typical Heusler alloy film material;

FIGS. 8A to 8C are charts illustrating a principle of increase in the performance index Z of the thermoelectric devices according to the present invention;

DETAILED DESCRIPTION OF THE INVENTION

With reference to drawings will be described embodiments of the present invention.

Figure 1:
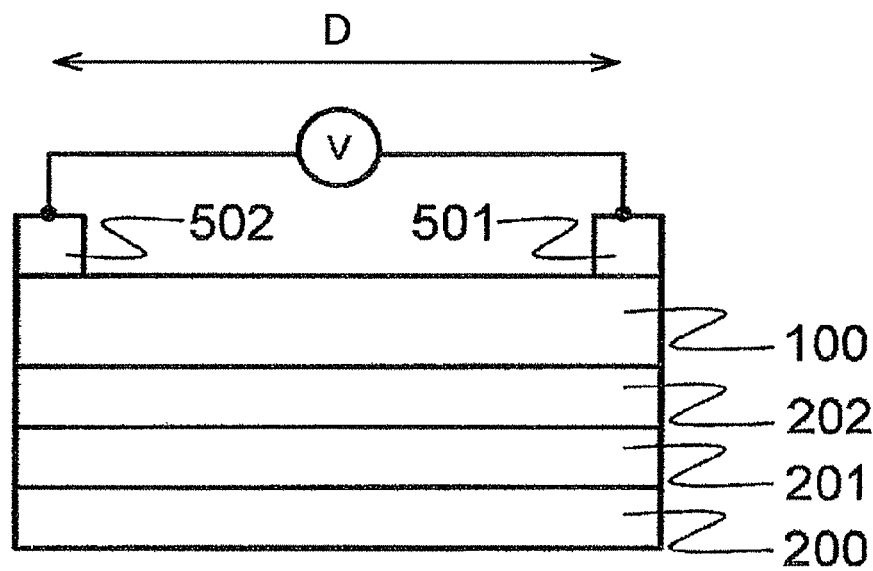
FIG. 1 is a cross section view of an example of a thermoelectric conversion device according to a first embodiment of the present invention.

FIG. 1 is a cross section view of an example of a thermoelectric conversion device (part) according to the present invention. The thermoelectric conversion device includes a Heusler alloy film 100 laminated on a substrate 200 having a small thermal conductivity through a buffer layer 201 and a seed layer 202, and a pair of electrodes 501 and 502. An electromotive force (thermal electromotive force) generated by a thermal gradient in the Heusler alloy film 100 is taken out (is outputted as a voltage V) by a pair of the electrodes 501 and 502 disposed at a predetermined distance D therebetween as shown in FIG. 1. The Heusler alloy film 100 has a crystal structure of $B_2$ or $L_{21}$ indicated in an $A_2BC$ notation. Elements used in A, B, and C in the $A_2BC$ notation are as follows:

A: a single element or a plurality of elements belonging to any of seventh to tenth groups of fourth to sixth periods in the periodic table.

B: a single element or a plurality of elements belonging to any of seventh to tenth groups of fourth to sixth periods in the periodic table.

C: a single element or a plurality of elements belonging to any of thirteenth to fourteenth groups of third to sixth periods of the periodic table. Ta, Ru, Ti, or Zr, etc. is used for the buffer layer 201. For the seed layer 202, a material having a body-centered cubic (bcc) structure such as V, Cr, and W or MgO, MgZnO, etc. is preferably used.

Adopting such materials for the seed layer 202 enables formation of the Heusler alloy film having the $B_2$ or $L_21$ structure. In addition, the Heusler alloy film having the $B_2$ or $L_{21}$ structure can be formed stably by heating the substrate at a temperature equal to or higher than 300° C. or a thermal process at a temperature equal to or higher than 300° C. while the Heusler alloy film is formed. Particularly, $Fe_2TiSn$ having the $L_{21}$ structure provides an extremely great performance index Z.

Figure 2:
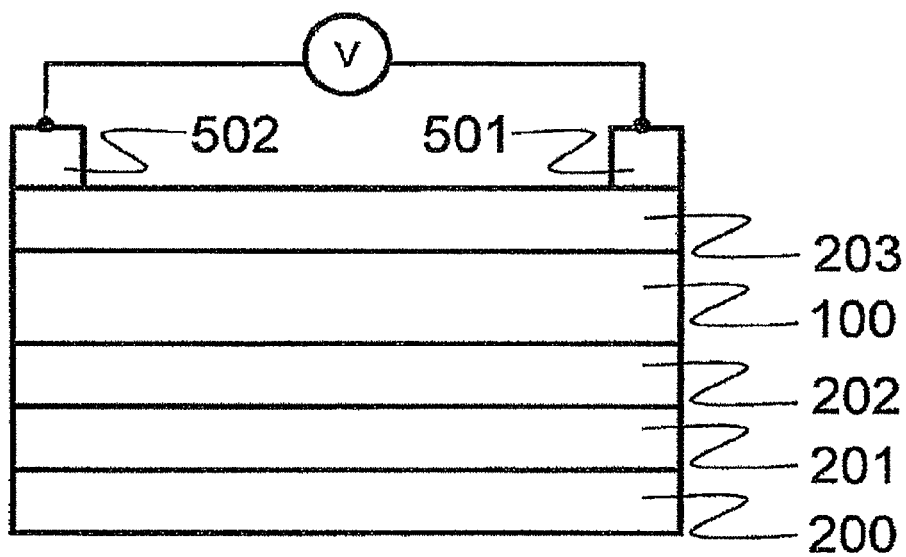
FIG. 2 is a cross section view of a configuration example of a thermoelectric conversion device according to a second embodiment of the present invention.

FIG. 2 shows a configuration in which a protection film 203 is laminated on the Heusler alloy film 100 of the thermoelectric conversion device shown in FIG. 1. Use of the protection film can prevent the Heusler alloy film 100 from deterioration. For the protection film 203, a material having a high melting point and a low thermal conductivity such as Ta or V are usable.

Figure 3:
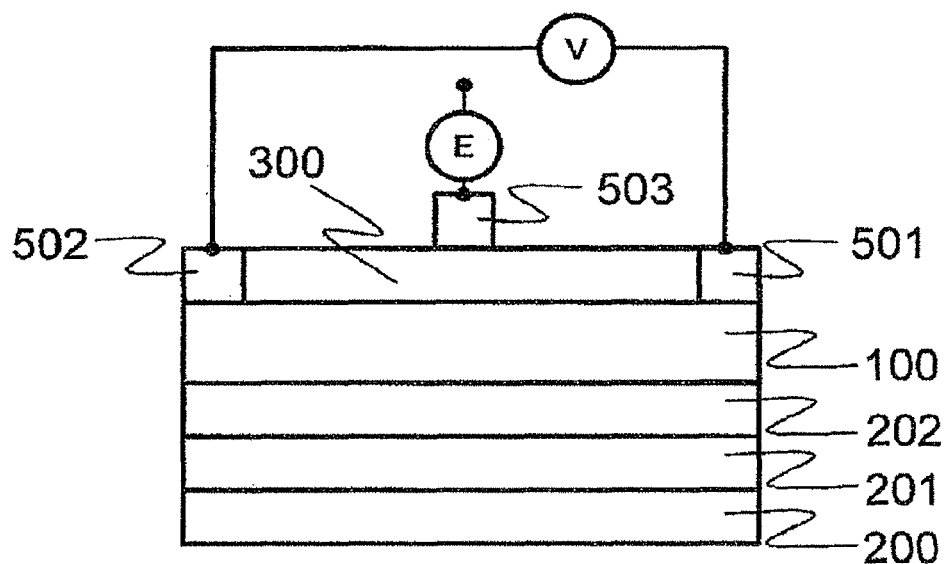
FIG. 3 is a cross section view of a configuration example of a thermoelectric conversion device according to a third embodiment of the present invention.

FIG. 3 shows another thermoelectric conversion device including the Heusler alloy film 100 laminated on the substrate having a small thermal conductivity, through the buffer layer 201 and the seed layer 202, a pair of the electrode 501 and the electrode 502, and an electrode 503 on the Heusler alloy film 100 through an insulation film 300. An electromotive force (thermal electromotive force) generated by thermal gradient in the Heusler alloy film 100 is taken out between a pair of the electrodes 501 and 502. The Heusler alloy film 100 has a crystal structure of $B_2$ or $L_{21}$ in notation of $A_2BC$. In the $A_2BC$ notation, elements used as A,B, and C are as follows:

A: a single element or a plurality of elements in the seventh to tenth groups of the fourth to sixth periods in the periodic table, and the crystal structure is formed with the single element or these more than one elements.

B: a single element or a plurality of elements in the fourth to sixth groups of the fourth to sixth periods in the periodic table, and the crystal structure is formed with the single element or these more than one of the elements.

C: a single element or a plurality of elements in the thirteenth to fourteenth groups of the third to sixth periods in the periodic table, and the crystal structure is formed with the single element or this more than one element.

For the buffer layer 201, Ta, Ru, Ti, and Zr are used. For the seed layer 202, a material having a body-centered cubic (bcc) structure such as V, Cr, and W or MgO, MgZnO, etc. is preferably used. Use of such materials for the seed layer 202 enables formation of the Heusler alloy film stably having $B_2$ or $L_{21}$ structure. In addition, formation of the Heusler alloy film stably having $B_2$ or $L_{21}$ structure can be provided by heating the substrate at a temperature equal to or higher than 300° C. in producing the Heusler alloy film or by a heat treatment at a temperature equal to or higher than 300° C. after production of the Heusler alloy film. The thermoelectric conversion device shown in FIG. 3 can apply an electric field to the Heusler alloy film 100 through the insulation film 300 by applying a voltage to the insulation film 300 from a power supply E externally installed. This can increase an electric conductivity σ and the Seebeck coefficient S of the Heusler alloy film 100. Hereinafter will be described a principle and operation in a case where $Fe_2VAl$, $Fe_2NbAl$, $Fe_2TiSi$, and $Fe_2TiSn$ are adopted for the Heusler alloy film 100. FIGS. 6A to 6D show increase quantities of the performance index Z of these Heusler alloy materials with respect to the voltage Vg applied to the electrodes 503. In each of the charts in FIGS. 6A to 6D, the performance index Z rapidly increases from voltages indicated by arrows. For example, in the case of $Fe_2VAl$, increase in the performance index Z is possible by applying a positive voltage, i.e., 0.5 V or a negative voltage, i.e., −0.3 V, so that increase is expected to be thirty-times increase to the maximum. FIG. 7 shows a table to show optimum application voltages of the four kinds of materials described above. From this table, it is found that in $Fe_2TiSn$, the increase in the performance index Z is possible at a low voltage of −0.1V. Next, with reference to FIG. 8, will be described a principle of increase in the performance index Z by the applied voltage. FIG. 8A shows a typical density of state of the Heusler metal film. The density of state indicates the number of electrons for each energy state. A vertical axis in FIG. 8A represents energy, and the horizontal axis represents the density of states of electrons (DOS). Fermi energy ($E_F$) indicated in FIG. 8A represents an energy of electrons are caused to be finally occupied in a band while electrons are caused to be occupied in bands from a lower energy band. When the voltage Vg is applied to the electrodes 503 to apply an electric field to the Heusler alloy film, the Fermi energy of the Heusler alloy increases by the applied voltage Vg (eV), and the density of state changes to a density of state DOS (Vg). In the example in FIG. 8A, an energy EF indicated with a solid line shifts to an energy EF indicated by broken lines from the state in which the voltage Vg is not applied to the state in which the voltage Vg is applied. The density of state DOS when the voltage Vg is applied increases and an inclination to energy is steep in comparison of the density of state DOS when Vg=0. Here, because the Seebeck index S defining the performance index Z is proportional to an inclination of the energy of the density of state DOS, the electric conductivity σ is proportional to the density of state DOS, an appropriate variation of the voltage Vg provides a state in which increase in both of the Seebeck index S and the electric conductivity σ are allowed. FIGS. 8A and 8C show Vg dependencies of the electric conductivity σ and the Seebeck coefficient Vg of the Heusler structure having the density of state shown in FIG. 8A. As shown in FIGS. 8B and 8C, it becomes possible that the electric conductivity σ increases with respect to the voltage Vg and the Seebeck coefficient S has a local maximum at a certain Vg value.

Figure 4:
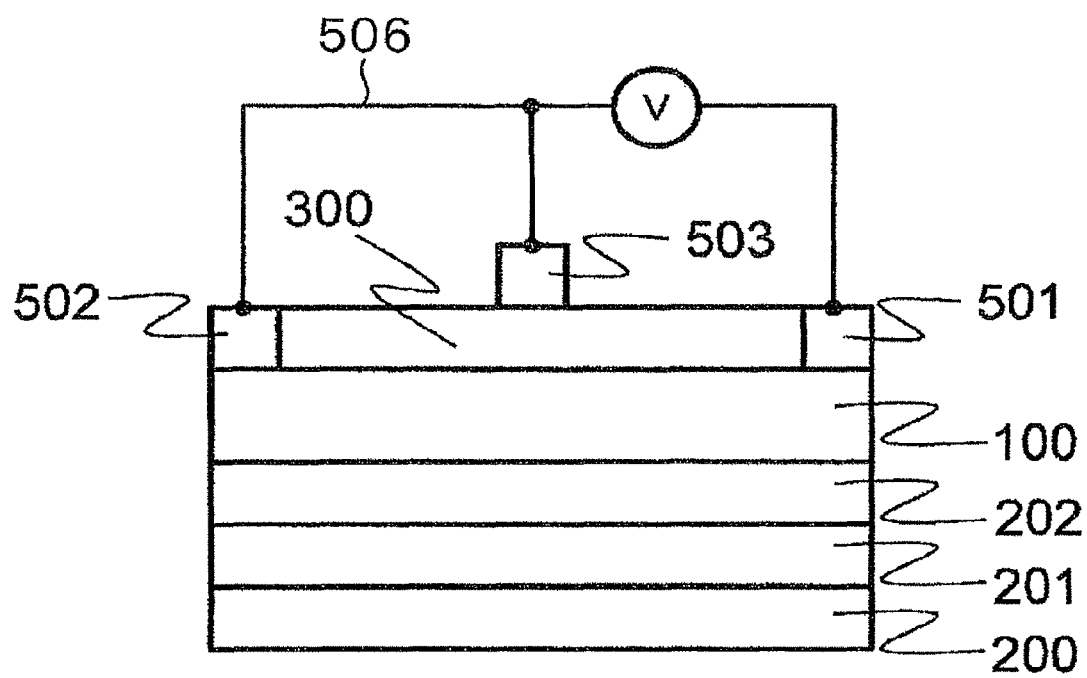
FIG. 4 is a cross section view of a configuration example of a thermoelectric conversion device according to a fourth embodiment of the present invention.
Figure 6A:
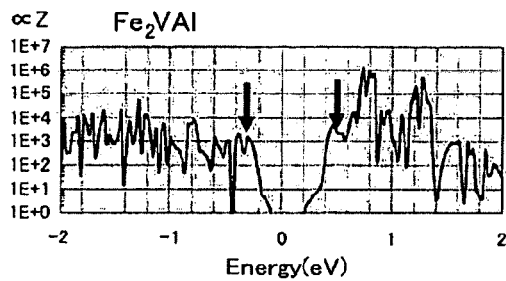
FIG. 6A to 6D are charts of performance indexes Z illustrating increase quantities with respect to applied voltages to the thermoelectric conversion devices according to the present invention.
Figure 6C:
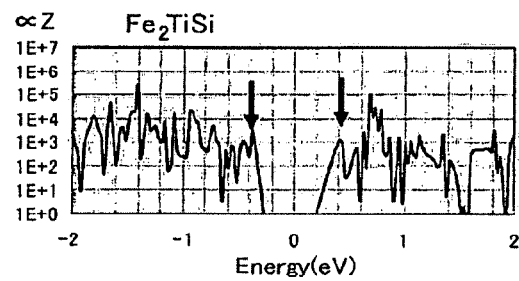
Figure 6B:
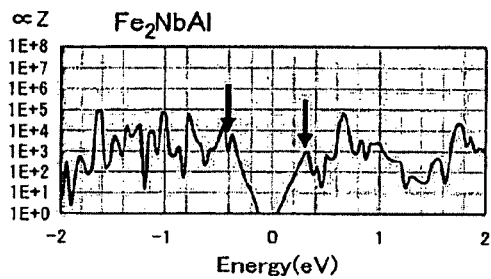
Figure 6D:
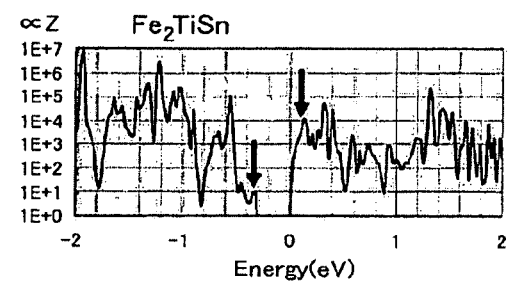

FIG. 4 shows an example of the thermoelectric conversion device allowing the electromotive force generated by the Heusler alloy film 100 itself to be applied to the electrode 503 through a line 506 in addition to the configuration shown in FIG. 3. This configuration provides a thermoelectric conversion device which does not require external power to be consumed because an external power supply is not used. Because the electromotive force generated by the thermoelectric conversion device itself has a level necessary for the application voltage shown in FIG. 7, it is possible that the performance index Z can be increased by the electromotive force generated by the thermoelectric conversion device itself.

Figure 9:
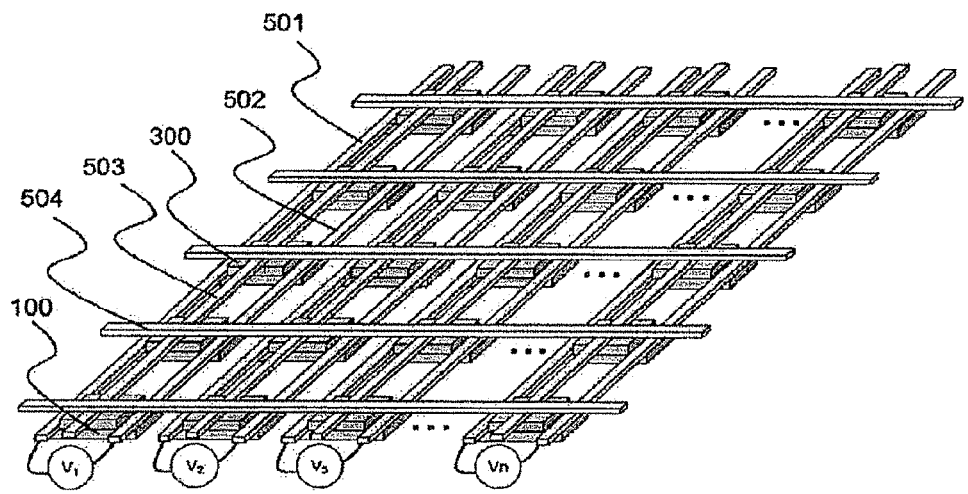
FIG. 9 shows an example of an array of the thermoelectric conversion device according to the present invention.

FIG. 9 shows a configuration of a thermoelectric conversion device in which a plurality of single thermoelectric conversion devices shown in FIG. 3 are disposed in an array, and the electrodes 501 and 502 have a shared connection among a plurality of the thermoelectric conversion devices. This configuration can increase the electromotive force which is taken out from a plurality of the thermoelectric conversion devices. In addition, the electrode 503 and the electrode 504 are disposed so as to cross each other above the other part of the thermoelectric conversion device, and voltages applied to the electrodes 503 and the electrode 504 are controlled to select one or more thermoelectric conversion device to which the voltage Vg is applied. For example, the thermoelectric device at a cross point between the electrode 503 supplied with Vg/2 and the electrode 504 supplied with −Vg/2 is not supplied with any voltage, because a total voltage is zero (Vg=0). On the other hand, the thermoelectric device at a cross point between the electrode 503 supplied with Vg/2 and the electrode 504 supplied with Vg/2 is supplied with a total of voltage of Vg (Vg=Vg).

Figure 10:
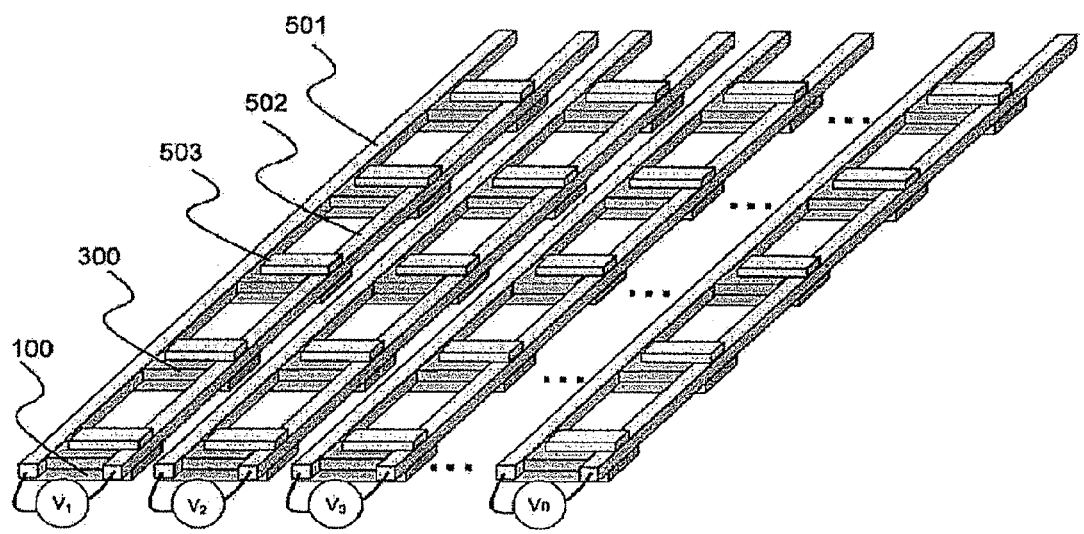
FIG. 10 shows an example of an array of the thermoelectric conversion device according to the present invention.

FIG. 10 shows a configuration of a thermoelectric conversion device in which a plurality of single thermoelectric conversion devices shown in FIG. 4 are disposed in an array, and the electrodes 501 and 502 have a shared connection among a plurality of the thermoelectric conversion devices. In this embodiment, the shared connection is a parallel connection of the thermoelectric conversion devices arranged in a line. This configuration can increase the electromotive force which is taken out from a plurality of the thermoelectric conversion devices by the parallel connection similar to the configuration shown in FIG. 9.

Figure 11:
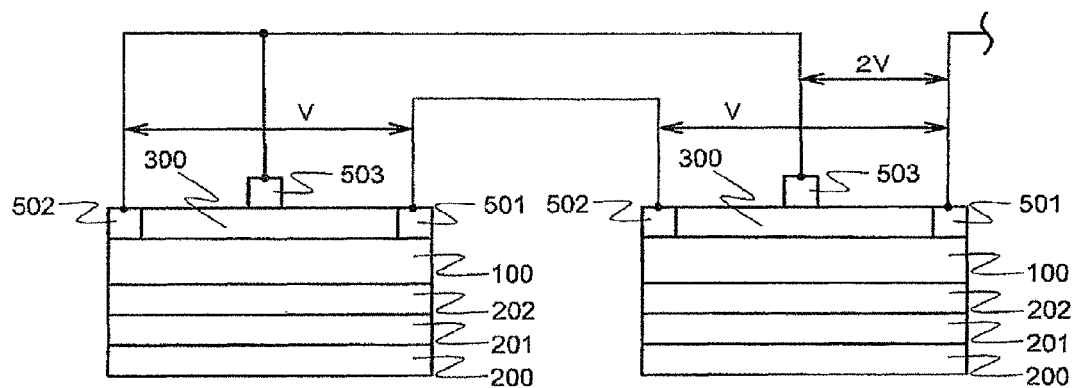
FIG. 11 is a circuit diagram of an example of an arrangement of the thermoelectric conversion devices according to the present invention.

FIG. 11 shows a configuration of a thermoelectric conversion device in which a plurality of single thermoelectric conversion devices shown in FIG. 4 are connected in series and may be disposed in an array, and the electrodes 501 and 502 have a shared connection among a plurality of the thermoelectric conversion devices. In this embodiment, the shared connection is a series connection of the thermoelectric conversion devices. Accordingly, the electromotive force (voltage) can be increased, because the electromotive force is taken out from a plurality of the thermoelectric conversion devices.

According to the present invention, the performance index Z can be increased as much as thirty-times or more the conventional performance indexes.

The invention claimed is:

1. A thermoelectric conversion device comprising:
at least one single thermoelectric conversion device, each at least one single thermoelectric conversion device including:
a Heusler alloy film;
a pair of electrodes on the Heusler alloy film at a predetermined distance therebetween to output an electromotive force generated by a thermal gradient in the Heusler alloy film;
an insulation film on the Heusler alloy film;
a gate electrode on the Heusler alloy film configured to apply an electric field or a voltage to the Heusler alloy film through the insulation film;
a buffer layer, wherein the buffer layer comprises Ta, Ru, Ti or Zr;
a seed layer on the buffer layer, wherein the seed layer comprises V, Cr, W, MgO or MgZnO; and
wherein the Heusler alloy film has a crystal structure of $L_{21}$ and is disposed on the buffer layer.

2. The thermoelectric conversion device as claimed in claim 1, wherein each Heusler alloy film comprises $Fe_2TiSn$.

3. The thermoelectric conversion device as claimed in claim 1, wherein the at least one single thermoelectric conversion device comprises a plurality of single thermoelectric conversion devices.

4. The thermoelectric conversion device as claimed in claim 3, wherein each of the Heusler alloy films comprise $Fe_2TiSn$.

* * * * *